US010032602B2

(12) United States Patent
Chou

(10) Patent No.: US 10,032,602 B2
(45) Date of Patent: Jul. 24, 2018

(54) METHOD FOR IMAGING WAFER WITH FOCUSED CHARGED PARTICLE BEAM IN SEMICONDUCTOR FABRICATION

(71) Applicant: Taiwan Semiconductor Manufacturing Co., Ltd, Hsin-Chu (TW)

(72) Inventor: Ting-Tsung Chou, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 196 days.

(21) Appl. No.: 14/739,198

(22) Filed: Jun. 15, 2015

(65) Prior Publication Data
US 2016/0365222 A1 Dec. 15, 2016

(51) Int. Cl.
H01J 37/00 (2006.01)
H01J 37/26 (2006.01)
H01J 37/21 (2006.01)
H01L 21/66 (2006.01)

(52) U.S. Cl.
CPC ............ *H01J 37/265* (2013.01); *H01J 37/21* (2013.01); *H01L 22/12* (2013.01); *H01J 2237/004* (2013.01); *H01J 2237/216* (2013.01)

(58) Field of Classification Search
CPC ...... H01J 37/292; H01J 37/026; H01J 37/265; H01J 37/21
USPC ................................ 250/306, 307, 310, 311
See application file for complete search history.

(56) References Cited

U.S. PATENT DOCUMENTS

| 6,521,891 B1* | 2/2003 | Dotan | H01J 37/21 250/307 |
| 7,732,765 B2* | 6/2010 | Yamaguchi | H01J 37/222 250/306 |
| 8,884,224 B2* | 11/2014 | Fang | H01J 37/026 250/306 |
| 2005/0258366 A1* | 11/2005 | Honda | H01J 37/21 250/310 |
| 2010/0181492 A1* | 7/2010 | Zhao | H01J 37/026 250/396 R |
| 2016/0172150 A1* | 6/2016 | Li | H01J 37/1478 250/310 |

FOREIGN PATENT DOCUMENTS

TW 201342420 10/2013

OTHER PUBLICATIONS

Chinese language office action dated Sep. 5, 2016, issued in application No. TW 104139350.

* cited by examiner

*Primary Examiner* — Michael Maskell
(74) *Attorney, Agent, or Firm* — McClure, Qualey & Rodack, LLP

(57) ABSTRACT

A method for processing a semiconductor wafer is provided. The method includes positioning the semiconductor wafer in a scanning electron microscope (SEM). The method further includes producing images of at least a portion of a test region that is designated on a process surface of the semiconductor wafer. The method also includes adjusting the condition of a charged particle beam of the SEM at a check point selected in the test region. In addition, the method includes producing images of another portion of the test region after the condition of the charged particle beam is adjusted.

20 Claims, 5 Drawing Sheets

METHOD FOR IMAGING WAFER WITH FOCUSED CHARGED PARTICLE BEAM IN SEMICONDUCTOR FABRICATION

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form an integrated circuit (IC) and elements thereon. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

During the manufacturing of the semiconductor devices, various processing steps are used to fabricate integrated circuits on a semiconductor wafer. One of the difficult factors in the continuing evolution toward smaller device size and higher density has been the ability to consistently form small critical dimensions within predetermined error windows. For example, semiconductor feature sizes are frequently subjected to optical or electrical metrology inspections following photolithographic patterning and etching to ensure that critical dimensions are within acceptable limits.

Although existing methods and devices for operating the processing steps have been generally adequate for their intended purposes, they have not been entirely satisfactory in all respects. Consequently, it would be desirable to provide a solution for the process control for semiconductor manufacturing operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
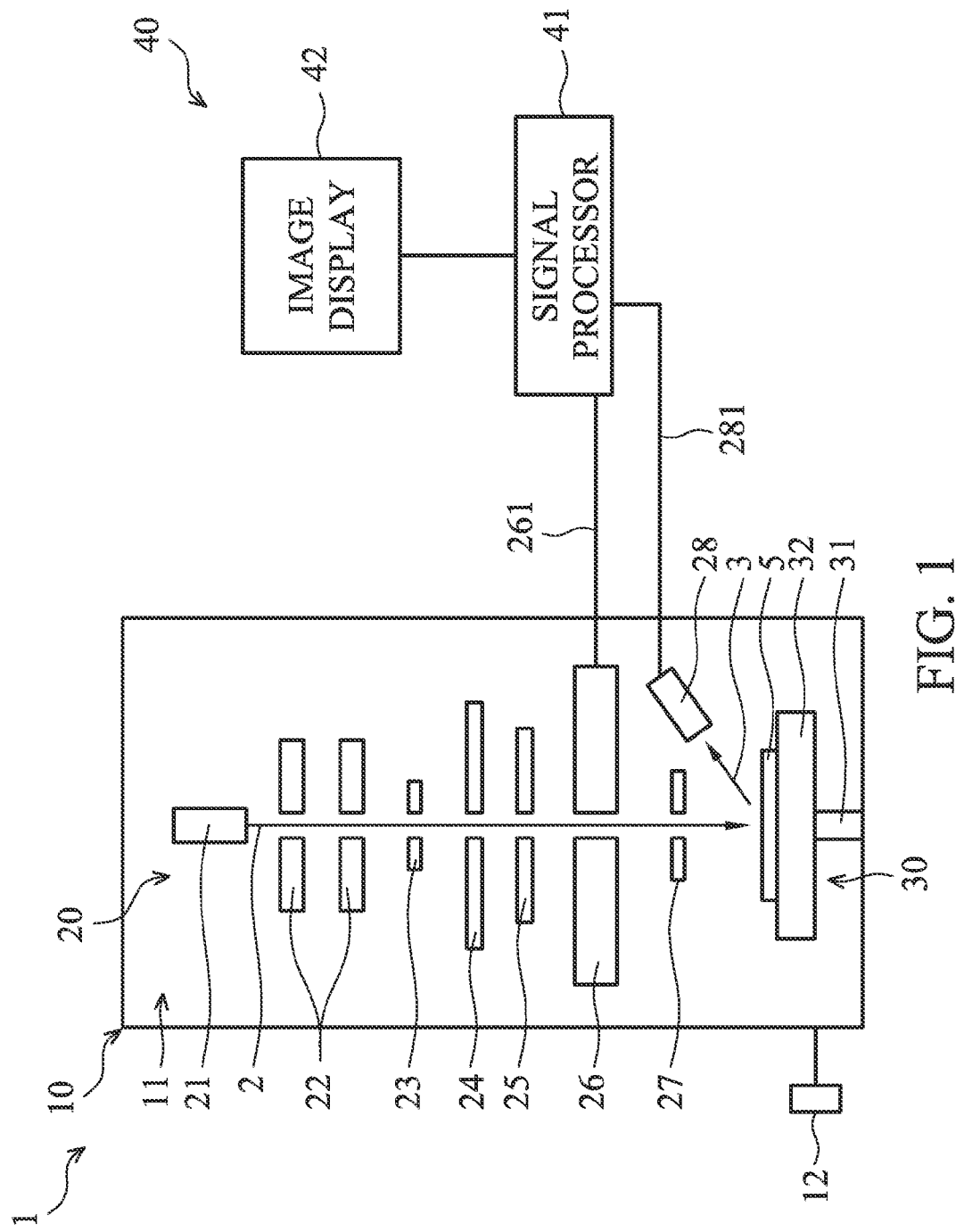
FIG. 1 is cross-sectional view of a microscope that uses accelerated charged particles as a source of illumination, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

FIG. 1 is a cross-sectional view of a wafer inspecting module 1 for inspecting a semiconductor wafer 5 in semiconductor manufacturing process, in accordance with some embodiments. In some embodiments, the wafer inspecting module 1 includes a chamber assembly 10, an image capturing assembly 20, a wafer stage assembly 30, and an image processing assembly 40. In some embodiments, the wafer inspecting module 1 is configured to produce magnify images of a semiconductor wafer 5. The elements of the wafer inspecting module 1 can be added to or omitted, and the disclosure should not be limited by the embodiments.

The chamber assembly 10 defines an enclosure 11 for receiving the semiconductor wafer 5 for performing the wafer inspection process. The image capturing assembly 20 and the wafer stage assembly 30 are positioned in the chamber assembly 10. In some embodiments, the chamber assembly 10 includes a vacuum producer 12. The vacuum producer 12 is configured to produce a vacuum in the enclosure 11. The vacuum producer 12 includes, for example, a fan, a blower, or a pump. In some embodiments, the enclosure 11 is kept in a high vacuum, for example, enclosure 11 is operating at about $10^{-6}$ Torr. Therefore, the scattering of the charged particle beam from the image capturing assembly 20 before reaching the semiconductor wafer 5 is minimized.

The image capturing assembly 20 is configured to produce and direct a charged particle beam 2 into the semiconductor wafer 5. In some embodiments, the image capturing assembly 20 includes a charged particle source 21 configured to emit a charged particle beam. In some embodiments, the charged particle source 21 is an electron gun fitted with a tungsten filament cathode. A charged particle beam is emitted from an electron gun. The electron gun may be made of a metal such as tungsten which has the highest melting point and lowest vapor pressure of all metals. As a result, the electron gun allows it to be heated for electron emission. In some embodiments, the charged particle beam from the charged particle source 21 has an energy ranging from about 100 keV to about 3000 keV.

In some embodiments, the image capturing assembly 20 further includes a number of elements arranged in a column to direct a charged particle beam from the charged particle source 21 to the semiconductor wafer 5. For example, the image capturing assembly 20 further includes a cap 22, an accelerating electrode 23, an upper stage condenser 24, a lower stage condenser 25, an objective lens 26, a scan coil 27, and a detector 28. It is appreciated that the elements of the image capturing assembly 20 can be added to or omitted, and the disclosure should not be limited by the embodiments.

In some embodiments, the cap 22 is configured to shape the charged particle beam. The cap 22 may surround the charged particle source 21 and has a small hole in the center through which electrons exit.

In some embodiments, the accelerating electrode 23 is configured to supply an acceleration voltage to the charged particle beam 2. The accelerating electrode 23 is positioned below the cap 22 to attract the charged particle beam 2 away from the charged particle source 21. Typically, with an increase in acceleration voltage will result in most charged particle beam 2 (i.e., primary electrons) traveling deeper within the semiconductor wafer 5. Therefore, a higher signal (and lower noise) in the final image is received by the detector 28.

The upper stage condenser 24, the lower stage condenser 25, and the objective lens 26 are configured to reduce the diameter of the charged particle beam 2. In some embodiments, each of the upper stage condenser 24, the lower stage condenser 25, and the objective lens 26 are an electromagnetic lens including a coil of wire through which electrical current flows.

In some embodiments, the upper stage condenser 24 and the lower stage condenser 25 are configured to reduce the diameter of the source of electrons and to place a small, focused beam of electrons (or spot) onto the semiconductor wafer 5. In some embodiments, the upper stage condenser 24 and the lower stage condenser 25 converges the cone of the charged particle beam to a spot below it, before the cone flares out again and is converged back again by the objective lens and down onto the semiconductor wafer 5. Since the upper stage condenser 24 and the lower stage condenser 25 controls the initial spot size of the charged particle beam, the upper stage condenser 24 and the lower stage condenser 25 are referred to as the spot size control. The diameter of this initial convergence (also called the cross-over point) affects the final diameter of the spot the beam makes on the sample.

In some embodiments, the objective lens 26 is configured to focus the charged particle beam 2 into a spot on the semiconductor wafer 5. The strength of the electrical current applied to the objective lens changes the position of the point at which the charged particle beam is focused on the semiconductor wafer. The charged particle beam can be focused at different working distances (the distance between the lower objective lens and the point of focus on the semiconductor wafer). For example, the charged particle beam can be focused below the process surface of the semiconductor wafer 5. Alternatively, the charged particle beam can be focused above the process surface of the semiconductor wafer 5. Alternatively, the charged particle beam can be focused just right at the process surface of the semiconductor wafer 5. The objective lens 26 may be in signal communication e.g., electrical signal line 261 with the image processing assembly 40.

In some embodiments, the scan coil 27 is configured to deflect the charged particle beam 2 in the X and Y axes so that it scans in a raster fashion over a test region (not shown in FIG. 1) of the process surface of the semiconductor wafer 5. The scan coil 27 may include a number of conductive plates. Sets of the plates are arranged around the path along which the charged particle beam passes. By varying the potential between them, the charged particle beam can be deflected.

In some embodiments, the electron detector 28 is configured to detect radiation beams produced from the semiconductor wafer 5. For example, the electron detector 28 is used to receive a secondary electron 3 which is expelled from the semiconductor wafer 5 after the incident of the charged particle beam 2 into the semiconductor wafer 5. In some embodiments, the electron detector 28 is positioned at a predetermined angle above and to one side of the stage assembly 30 to capture the secondary electrons 3 emitted from the sample surface following the primary charged particle beam 2 impacts. The electron detector 28 may be supplied with about a 10 keV positive potential on its face, so as to attract the secondary electrons 3 emitted from the process surface of the semiconductor wafer 5. The electron detector 28 may be in signal communication e.g., electrical signal line 281 with the image processing assembly 40.

The image processing assembly 40 includes a signal processor 41 and an image display 42. In some embodiments, the signal processor 41 includes a signal processing unit for processing the signal prior to the transfer to an image display 42 to produce a brightness contrast image representative of an electrical resistance in conductive portions of the IC to aid in electrical failure analysis of conductive portions, e.g., conductive interconnect wiring of the IC sample.

The image display 42 displays an image of a portion of the sample in response to the input signal to the signal processor 41 and the output signal to the image display 42. The input signal to the signal processor 41, for example a current signal from the electron detector 28, is processed by the signal processor 41 with the aid of information supplied by the objective lens 26. Therefore, a displayed image corresponding to an area scanned by the primary charged particle beam is shown in the image display 42.

In some embodiments, the image processing assembly 40 is supplied with automated controls for adjusting the various beam parameters. In some embodiments, the image processing assembly 40 is provided with a computer controlled graphical user interface including displays of the various beam parameters including electron beam voltage. In some embodiments, the image processing assembly 40 is equipped with a processing system for retrieving and storing electron beam condition parameters.

The stage assembly 30 is configured for holding, positioning, moving, and otherwise manipulating the semiconductor wafer 5. In some embodiments, the stage assembly 30 includes an actuator 31 and a wafer holder 32. The actuator 31, for example, a step motor, is coupled to the wafer holder 32 to drive the wafer holder 32. As a result, the semiconductor wafer holder 32 is designed and configured to be operable for translational and rotational motions.

In some embodiments, the wafer holder 32 is further designed to tilt or dynamically change the tilt angle. In some embodiments, a desired working distance between the objective lens 26 and the process surface (i.e., top surface) of the semiconductor wafer 5 is controlled by the actuator 31. The semiconductor wafer 5 may be secured on the wafer holder 32 by a clamping mechanism, such as vacuum clamping or e-chuck clamping. In some embodiments, the wafer holder 32 is fitted with a suitable mechanism to provide electrical current to the semiconductor wafer 5 so as to improve inspecting resolution.

In some embodiments, the semiconductor wafer 5 is electrically grounded via the wafer holder 32. In some embodiments, the wafer holder 32 is positively charged. Negatively charged electrons are attracted to the positively charged semiconductor wafer 5 and move toward it. Electrons that are not absorbed by the semiconductor wafer 5 may travel to the positively charged wafer holder 32.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

Figure 2:
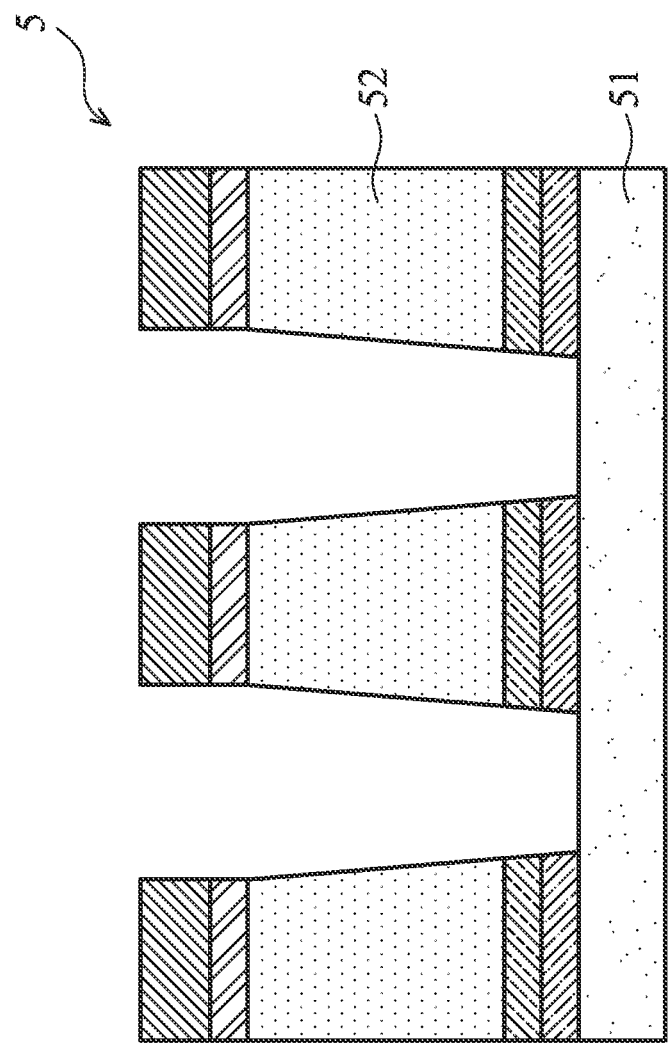
FIG. 2 is cross-sectional view of a wafer with an insulating layer, in accordance with some embodiments.

In some embodiments, as shown in FIG. 2, an insulating layer 52 is formed over a substrate 51 of the semiconductor wafer 5. The insulating layer 52 may be directly formed on the substrate 51. Alternatively, other material may be formed between the insulating layer 52 and the substrate 51. The insulating layer 52 may be formed at an outermost position on the semiconductor wafer 5 and be exposed to the outside. However, it should be appreciated that many variations and modifications can be made to embodiments of the disclosure.

In some embodiments, the insulating layer 52 is covered by a conductive layer (such as a metal layer). The insulating layer 52 is not formed at an outermost position on the semiconductor wafer 5. The flow path of the electron from the conductive layer to the substrate 51 is blocked by the insulating layers 52. In some embodiments, there are a number of the insulating layers 52 formed between the conductive layer and the substrate 51.

In some embodiments, the insulating layer 52 is omitted. Multiple conductive layers are formed over the substrate 51. However, due to complex structure of the multiple conductive layers, a flow path of the electron from the outermost conductive layer to the substrate 51 is blocked by the other conductive layers 52.

In some embodiments, the insulating layer 52 is a titanium nitride. However, it should be appreciated that many variations and modifications can be made to embodiments of the disclosure. In some other embodiments, the insulating layer 52 is selected from a group of consisting of silicon dioxide, silicon nitride, and silicon oxynitride.

Figure 3:
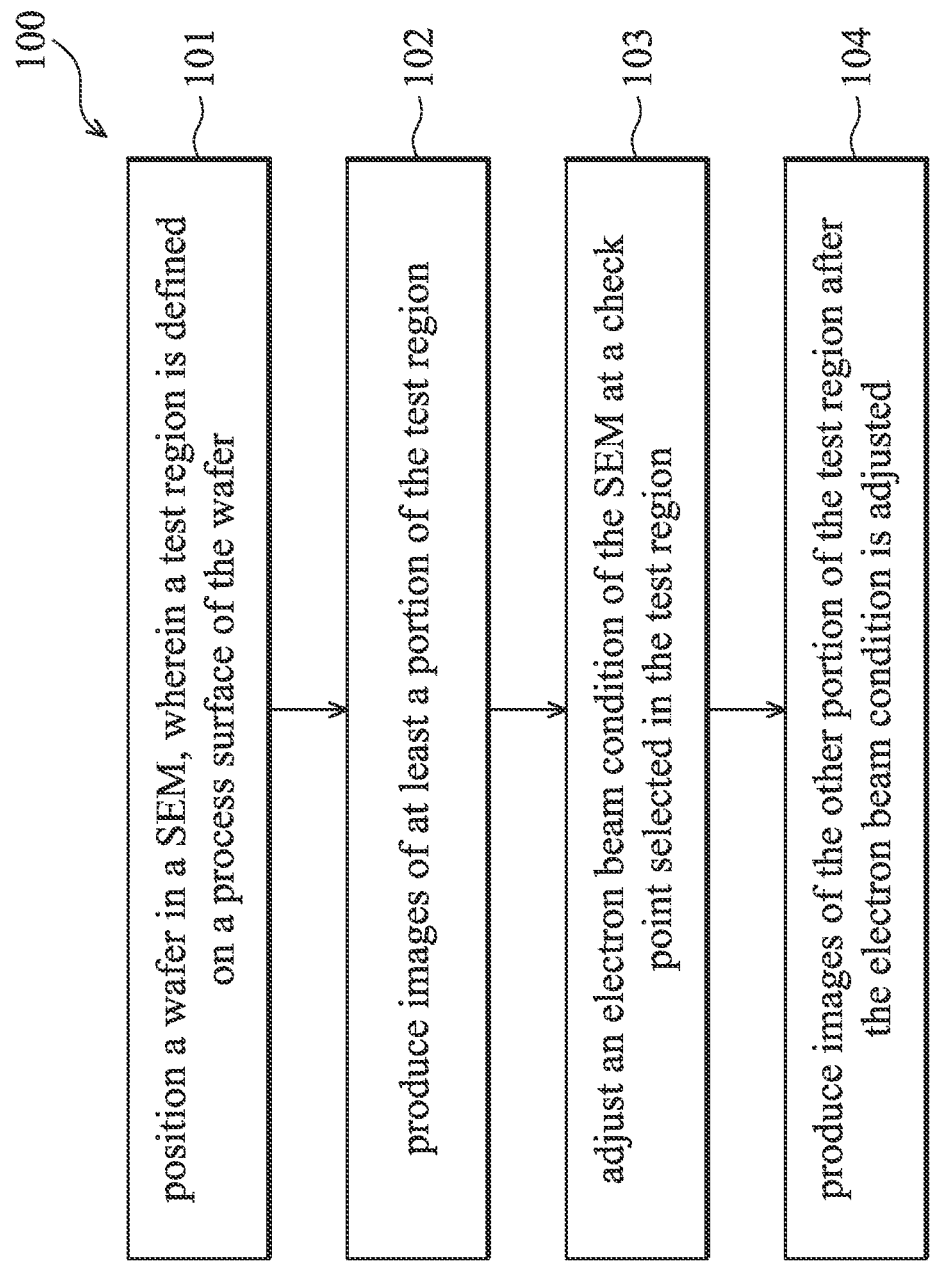
FIG. 3 is a flow chart of methods for cleaning a wafer, in accordance with some embodiments.

FIG. 3 is a flow chart illustrating a method 100 for cleaning a wafer, in accordance with some embodiments. For illustration, the flow chart will be described in company with the schematic views shown in FIGS. 1, 2, and 4-5. Some of the stages described can be replaced or eliminated for different embodiments. Additional features can be added in the semiconductor device structure. Some of the features described below can be replaced or eliminated for different embodiments.

The method 100 begins with an operation 101 in which a semiconductor wafer (such as the semiconductor wafer 5) is positioned in a scanning electron microscope (SEM, such as the wafer inspecting module 1). In some embodiments, the semiconductor wafer 5 is mounted on the wafer holder 32 by a clamping mechanism, such as vacuum clamping or e-chuck clamping. In some embodiments, after the semiconductor wafer 5 is positioned on the wafer holder 32, a working distance between the objective lens 26 and a process surface (top surface) of the semiconductor wafer 5 is adjusted by driving the actuator 31 to move the wafer holder 32 up and down.

In some embodiments, the semiconductor wafer 5 is transferred to the wafer inspecting module 1 by a transferring module (not shown in figures). In some embodiments, before the semiconductor wafer 5 is transferred to the wafer inspecting module 1, the semiconductor wafer 5 is kept in a load lock module (not shown in figures). The load lock module is configured for preserving the atmosphere within the enclosure 11 of the wafer inspecting module 1 by separating it from the environment. The load lock module is capable of creating an atmosphere compatible with the enclosure 11 where the semiconductor wafer 5 is scheduled to be next.

The method 100 continues to operation 102, in which images of at least a portion of a test region of the semiconductor wafer 5 are produced by the SEM 1 (such as the wafer inspecting module 1). As shown in FIG. 4A, in some embodiments, a test region 50 is designated by a user on a process surface 53 of the semiconductor wafer 5. The test region 50 can be located at any position on the process surface 53. In some embodiments, the shape of the test region 50 is rectangular and has a number of boundary lines, such as boundary lines 501, 502, 503, and 504. In some embodiments, an area of the test region 50 is in a range from about 0.04 mm$^2$ to about 5.7 mm$^2$. However, it should be appreciated that many variations and modifications can be made to embodiments of the disclosure. The test region 50 may be any other shape according to demand.

Figure 4B:
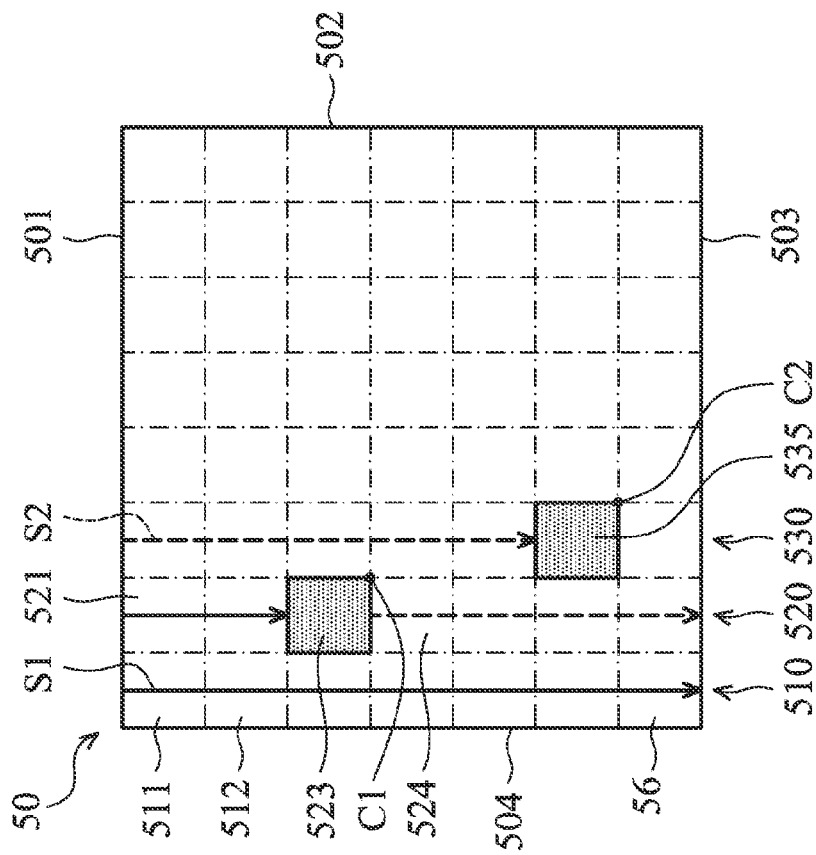
FIG. 4B is a schematic view of a semiconductor wafer scanned by a charged particle beam during a scanning operation, in accordance with some embodiments.
Figure 4A:
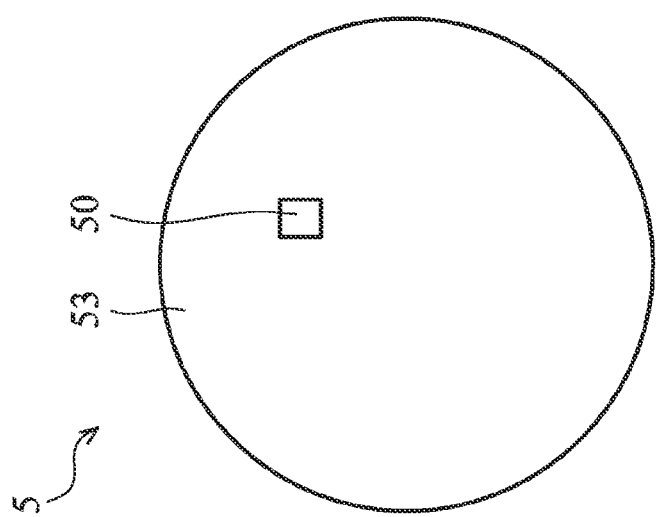
FIG. 4A is a schematic view of a wafer in which a test region is defined on a process surface thereof, in accordance with some embodiments.

As shown in FIG. 4B, in the test region 50, a number of sub-frames are defined in a matrix, in accordance with some embodiments. For example, a number of columns (such as columns 510, 520, and 530) of the sub-frames are arranged adjacent to one another in a horizontal direction. Each of the columns 510, 520, and 530 of the sub-frames includes a number of sub-frames (such as the sub-frames 511, 512, and 513) arranged in order along a vertical direction.

It should be appreciated that while there are only six sub-frames in each of the columns 510, 520, and 530 of the sub-frames shown in FIG. 4B, the illustration is exaggerated to clearly exemplify the method of the present invention. Each of the columns 510, 520, and 530 of the sub-frames may include hundreds or thousands of sub-frames arranged adjacent to one another in a vertical direction.

To produce the images of a portion of the test region 50, a first scanning operation is performed by the image capturing assembly 20. In the beginning of the first scanning operation, focus is set at the beginning when the recipe setup. Both objective lens 26 and wafer stage assembly 30 are adjusted to make sure the focus is good. Afterwards, the charged particle beam 2 produced by the image capturing assembly 20 is driven to scan each of the sub-frames in the order indicated by the arrow S1 shown in FIG. 4B. The charged particle beam 2 of the first scanning operation has a first charged particle beam condition and is focused by the objective lens 26 to have a first focal length.

Figure 5A:
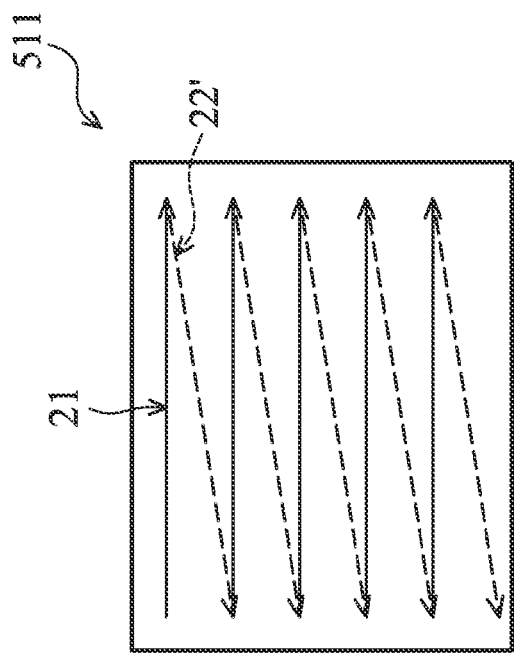
FIGS. 5A and 5B are schematic view of a test region during a scanning operation, in accordance with some embodiments.

In some embodiments, each of the sub-frames is scanned by the charged particle beam in a raster fashion as shown in FIG. 5A. For example, the charged particle beam 2 scans the sub-frame 511 along one of the line-scanning paths 21 (in a solid line). Afterwards, the charged particle beam 2 scans one of the beam-retracing paths 22 (in a dash line) that reverses its previous line-scanning path 21. However, it should be appreciated that may variations and modifications can be made to embodiments of the disclosure.

Figure 5B:
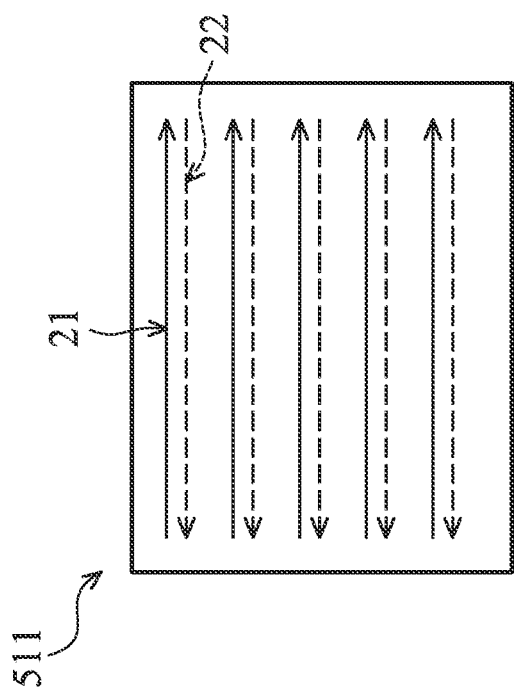

In some embodiments, the charged particle beam may scan the sub-frame 511 in a raster fashion as shown in FIG. 5B. The charged particle beam 2 scans the sub-frame 511 along one of the line-scanning paths 21 (in a solid line). Afterwards, the charged particle beam 2 scans one of the beam-retracing paths 22' (in a dash line) that connects the finished end of a scanned line-scanning path 21 to the start end of the next line-scanning path 21 that is scheduled to be scanned.

During the scanning operation, there is a period of beam-retracing between each two adjacent periods of line-scanning. The acquisition of the secondary electron detection signal by the detector 28 will be done during each period of line-scanning. The acquisition of the secondary electron detection signal by the detector 28 will not be done during each period of beam-retracing.

As will be recognized by one skilled in the art of scanning electron microscopy, there are a wide variety of additional metrology tools that may be added to the imaging functions of the SEM including for example, X-ray compositional analysis and focused ion beam milling.

In some embodiments, after the whole area of the sub-frames 511 is scanned by the charged particle beam 2, an image of the sub-frame 511 is displayed and recorded by the image processing assembly 40. Afterwards, the charged particle beam 2 starts out scanning the sub-frame 502 in the column 510 and so on. As shown in FIG. 4B, if the last sub-frame 506 in the column 510 is imaged, the sub-frame 521 in the column 520 is scanned consecutively by the charged particle beam 2. The method for producing images of the other sub-frames may be the same as that for producing an image of sub-frame 501. Therefore, for the sake of brevity, it is not described again here.

In some embodiments, the electrons from the charged particle beam 2 will not be easily removed via the substrate 51, and a charge accumulation problem occurs. The charges may be accumulated in the insulating layer 52 or a conductive layer formed over the insulating layer 52. It is appreciated that the charge accumulation problem may also occur, in spite of the omission of the insulating layer 52. The charges may be accumulated in multiple conductive layers with complex structure.

As more and more electrons are accumulated, it will not only give off secondary electrons for imaging the test region 50 but will also give off the electrons from being charged. The result is an image produced by the SEM 1 that begins to glow brighter and brighter and becomes distorted.

To address the problem described above, the method 100 continues to an operation 103, in which the condition of the charged particle beam of the SEM 1 is adjusted at a check point designated in the test region 50 to focus the charged particle beam 2 on the test region 50. In some embodiments, as shown in FIG. 4B, a check point C1 is designated at the last scanning spot of the sub-frame 523. The first scanning operation is stopped when the charged particle beam 2 finishes the scanning of the check point C1 in the sub-frame 523.

In some embodiments, after the first scanning operation is stopped, a focus tracking function is performed to ensure the charged particle beam 2 is in focus. In the focus tracking function, many parameters of the SEM 1 are changed. For example, the power of the charged particle source 21 may be decreased. The acceleration voltage supplied to the accelerating electrode 23 may be lowered. As a result, electrons ejected into the test region 50 are reduced or eliminated. Alternatively or additionally, the current supplied to the magnetic coil 26 are changed so as to adjust the focal point of the charged particle beam 2 at the test region 50. In some embodiments, the focus tracking function is performed by the image processing assembly 40 automatically. In some embodiments, a manual fine-tuning is performed after the focus tracking function conducted by the image processing assembly 40 is finished. Since the condition of the charged particle beam is adjusted, the charged particle beam 2 is focused on the test region 50 again and a focused image can be produced.

The method 100 continues to an operation 104, in which images of another portion of the test region 50 are produced after the condition of the charged particle beam is adjusted.

To produce the images of another portion of the test region 50, a second scanning operation is performed by the image capturing assembly 20 after the condition of the charged particle beam 2 is adjusted. In the second scanning operation, the charged particle beam 2 produced by the image capturing assembly 20 is driven to scan each of the sub-frames in the order indicated by the arrow S2 shown in FIG. 4B. The method for producing image of the sub-frames in the second scanning operation may be the same as that for producing an image of sub-frame 501. Therefore, for the sake of brevity, it is not described again here.

The charged particle beam 2 of the second scanning operation has a second charged particle beam condition and is focused by the magnetic coil 26 to have a second focal length. The second charged particle beam condition is different from the first charged particle beam condition, and the second focal length is different from the first focal length.

In some embodiments, as shown in FIG. 4B, the sub-frame 524 adjacent to the sub-frame 523 of the test region 50 is imaged in the beginning of the second scanning operation, and the second scanning operation is finished after scanning of the sub-frame 536. The second scanning operation is stopped when the charged particle beam 2 finishes the scanning of the check point C2 in the sub-frame 536. Afterwards, another focus tracking function is performed.

In some embodiments, the remaining sub-frames in the test region are imaged by another scanning operation. Between every two scanning operations, a focus tracking function is performed.

In some embodiments, the number of images recorded in each scanning operation is the same. Namely, the number of images recorded during the first scanning operation is the same as the number of images recorded during the second scanning operation. In some embodiments, the time period for processing each of the scanning operations is the same. Namely, the first preset time period for processing the first scanning operation is the same as the second preset time period for processing the second scanning operation. However, it should be appreciated that many variations and modifications can be made to embodiments of the disclosure. In some embodiments, with the increase of the scanning area in the test region, the number of images recorded in each scanning operation gradually reduces, and the preset time period for each scanning operation is gradually eliminated.

Embodiments of mechanisms for inspecting a semiconductor wafer described above use a charged particle beam with varied conditions to image a test region designated by a user. After a portion of area in the test region is scanned by the charged particle beam, the scanning operation is temporarily stopped, and a focus tracking function is performed to ensure images are in focus in the following scanning operation. Therefore, crisp and undistorted images are displayed and recorded, and a critical dimension of semiconductor features in the test region is inspected with high sensitivity. The quality control is thereby improved leading to improved processes and improved semiconductor device reliability. In addition, since the focus tracking function is performed periodically, a larger area (5.7 mm$^2$ in one of the embodiments) of the test region to be examined can be designated despite the fact that charges accumulate in the semiconductor wafer.

In accordance with some embodiments, the disclosure provides a method for processing a semiconductor wafer. The method includes positioning the semiconductor wafer in a scanning electron microscope (SEM). The method further includes producing images of at least a portion of a test region that is designated on a process surface of the semiconductor wafer. The method also includes adjusting the condition of a charged particle beam of the SEM at a check point selected in the test region. In addition, the method includes producing images of another portion of the test region after the condition of the charged particle beam is adjusted.

In accordance with some embodiments, the disclosure provides a method for inspecting a semiconductor wafer. The method includes performing a first scanning operation for imaging at least a portion of a test region of a process surface on the semiconductor wafer by supplying a charged particle beam. The method further includes stopping the first scanning operation before the test region being completely imaged. The method also includes performing a second scanning operation for imaging another portion of the test region by supplying an adjusted charged particle beam.

In accordance with some embodiments, the disclosure provides a method for inspecting a semiconductor wafer. The method includes performing a first scanning operation for imaging at least a portion of a test region of a process surface on the semiconductor wafer by supplying a charged particle beam. The method further includes stopping the first scanning operation after the first scanning operation has been performed for a first preset time period. The method also includes performing a second scanning operation for imaging another portion of the test region by supplying an adjusted charged particle beam.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for processing a semiconductor wafer, comprising:
   positioning the semiconductor wafer in a scanning electron microscope (SEM);
   scanning a charged particle beam over a first portion of the semiconductor wafer to produce images of the first portion of a test region which is designated on a process surface of the semiconductor wafer and stopping the scanning of the charged particle beam over the first portion at a check point in the test region;
   adjusting a condition of a charged particle beam of the SEM at the check point in the test region while the charged particle beam stays at the check point; and
   scanning the charged particle beam over a second portion of the semiconductor wafer to produce images of the second portion of the test region which is different from the first portion after the condition of the charged particle beam is adjusted;
   wherein the producing of the images of the first portion of the test region, the adjustment of the condition of the charged particle beam and the producing of the images of the second portion of the test region are consecutively performed.

2. The method as claimed in claim 1, wherein the operation of adjusting a charged particle beam condition comprises adjusting a focal point position of the charged particle beam on the test region.

3. The method as claimed in claim 1, wherein the operation of adjusting a charged particle beam condition comprises adjusting an acceleration voltage applied to the charged particle beam.

4. The method as claimed in claim 1, wherein a plurality of check points are selected, and the condition of the charged particle beam is adjusted in each of the check points.

5. The method as claimed in claim 1, wherein a plurality of images of the test region are recorded, and an area of the test region is in a range from about 0.04 mm$^2$ to about 5.7 mm$^2$.

6. The method as claimed in claim 1, further comprising forming an insulating layer over the process surface of the semiconductor wafer, wherein during the supply of the charged particle beam positive charges are generated on the insulating layer.

7. The method as claimed in claim 1, wherein in the operation of positioning the semiconductor wafer in a SEM, the semiconductor wafer is held by a substrate stage of the SEM, and the positive charges are isolated from electrical ground of the substrate stage by the insulating layer.

8. A method for inspecting a semiconductor wafer having a process surface, comprising:

performing a first scanning operation for imaging a first portion of a test region of the process surface on the semiconductor wafer;

stopping the first scanning operation before the test region is completely imaged and adjusting a condition of the charged particle beam; and performing a second scanning operation for imaging a second portion of the test region by supplying an adjusted charged particle beam;

wherein during an interval between the first scanning operation and the second scanning operation the charged particle beam stays at a check point and the condition of the charged particle beam is adjusted;

wherein the first scanning operation, the adjustment of the condition of the charged particle beam and the second scanning operation are consecutively performed.

9. The method as claimed in claim 8, further comprising forming an insulating layer over the semiconductor wafer, wherein the charged particle beam comprises an electron beam, and during the period of the first scanning operation, positive charges are generated on the insulating layer.

10. The method as claimed in claim 8, wherein the test region is defined by at least one boundary line, and the first scanning operation is finished at a terminal scanning point which is located in the test region and not overlapped by the boundary line.

11. The method as claimed in claim 8, wherein a plurality of images are recorded during each of the first scanning operation and the second scanning operation, wherein the number of images recorded during the first scanning operation is the same as the number of images recorded during the second scanning operation.

12. The method as claimed in claim 8, wherein the charged particle beam is supplied with a first acceleration voltage, and the adjusted charged particle beam is supplied with a second acceleration voltage, wherein the first acceleration voltage is greater than the second acceleration voltage.

13. The method as claimed in claim 8, further comprising performing a focus tracking function with the charged particle beam having different focus parameters illuminating on a single spot within the first portion of the test region before the second scanning operation.

14. A method for inspecting a semiconductor wafer having a process surface, comprising:

performing a first scanning operation for imaging a first portion of a test region of the process surface by supplying a charged particle beam;

stopping the first scanning operation after the first scanning operation has been performed for a first preset time period and adjusting a condition of the charged particle beam; and performing a second scanning operation for imaging a second portion of the test region by supplying an adjusted charged particle beam;

wherein during an interval between the first scanning operation and the second scanning operation the charged particle beam stays at a check point and the condition of the charged particle beam is adjusted;

wherein the first scanning operation, the adjustment of the condition of the charged particle beam and the second scanning operation are consecutively performed.

15. The method as claimed in claim 14, further comprising forming an insulating layer over the semiconductor wafer, wherein the charged particle beam comprises an electron beam, and during the period of the first scanning operation positive charges are generated on the insulating layer.

16. The method as claimed in claim 14, wherein the test region is defined by at least one boundary line, and the first scanning operation is finished at a terminal scanning point which is located in the test region and not overlapped by the boundary line.

17. The method as claimed in claim 14, wherein the second scanning operation is stopped after the second scanning operation is performed for a second preset time period, wherein the first preset time period is the same as the second preset time period.

18. The method as claimed in claim 14, wherein the charged particle beam is supplied with a first acceleration voltage, and the adjusted charged particle beam is supplied with a second acceleration voltage, wherein the first acceleration voltage is greater than the second acceleration voltage.

19. The method as claimed in claim 14, further comprising performing a focus tracking function with the charged particle beam having different focus parameters illuminating on a single spot within the first portion of the test region before the second scanning operation.

20. The method as claimed in claim 1, further comprising performing a focus tracking function with the charged particle beam having different focus parameters illuminating on the check point within the first portion before the second scanning operation.

* * * * *